(12) United States Patent
Heck et al.

(10) Patent No.: US 9,099,352 B2
(45) Date of Patent: Aug. 4, 2015

(54) SEMICONDUCTOR SUBSTRATE FOR AN OPTICAL RECEIVER

(75) Inventors: John Heck, Berkeley, CA (US);
Ansheng Liu, Cupertino, CA (US);
Brian H. Kim, Fremont, CA (US)

(73) Assignee: Intel Corporation, Santa Clara, CA (US)

( * ) Notice: Subject to any disclaimer, the term of this patent is extended or adjusted under 35 U.S.C. 154(b) by 103 days.

(21) Appl. No.: 13/997,615

(22) PCT Filed: Dec. 8, 2011

(86) PCT No.: PCT/US2011/064026
§ 371 (c)(1),
(2), (4) Date: Jun. 24, 2013

(87) PCT Pub. No.: WO2013/085529
PCT Pub. Date: Jun. 13, 2013

(65) Prior Publication Data
US 2013/0273672 A1     Oct. 17, 2013

(51) Int. Cl.
*H01L 21/66* (2006.01)
*G01B 11/14* (2006.01)
*H01L 23/544* (2006.01)
*H01L 31/02* (2006.01)
*H01L 31/0232* (2014.01)

(52) U.S. Cl.
CPC .............. *H01L 22/12* (2013.01); *G01B 11/14* (2013.01); *H01L 23/544* (2013.01); *H01L 31/02005* (2013.01); *H01L 31/02325* (2013.01); *H01L 2224/16225* (2013.01)

(58) Field of Classification Search
CPC ........ H01L 22/12; H01L 22/14; H01L 23/544; H01L 31/02325; H01L 31/02005; H01L 2224/16225
See application file for complete search history.

(56) References Cited

U.S. PATENT DOCUMENTS 5,883,996 A    3/1999    Knapp et al.
6,103,398 A    8/2000    Norton et al.
(Continued)

FOREIGN PATENT DOCUMENTS

EP         0404301 A2     12/1990

OTHER PUBLICATIONS

International Search Report and Written Opinion for PCT/US2011/064026, mailed Aug. 27, 2012, 7 pages.
(Continued)

*Primary Examiner* — Marvin Payen
*Assistant Examiner* — Victor Barzykin
(74) *Attorney, Agent, or Firm* — Schwabe Williamson & Wyatt PC

(57) ABSTRACT

Embodiments of the present disclosure describe semiconductor substrate techniques and configurations for an optical receiver. In one embodiment, a system includes a semiconductor substrate having one or more optical alignment features formed in a surface of the semiconductor substrate and an optical receiver assembly coupled with the semiconductor substrate, the optical receiver assembly including a photodetector device coupled with the surface of the semiconductor substrate, wherein the one or more optical alignment features facilitate precise optical alignment between a lens assembly and the photodetector device when the lens assembly is coupled with the semiconductor substrate using the one or more optical alignment features. Other embodiments may be described and/or claimed.

22 Claims, 5 Drawing Sheets

(56) References Cited

U.S. PATENT DOCUMENTS

2002/0015557 A1* 2/2002 Yap et al. .................... 385/33
2002/0172448 A1   11/2002 Paniccia et al.
2004/0218848 A1* 11/2004 Shen et al. .................. 385/14
2011/0315858 A1* 12/2011 Heck et al. ................ 250/214 A

OTHER PUBLICATIONS

International Preliminary Report on Patentability and Search report for PCT Application No. PCT/US2011/064026, dated Jun. 19, 2014.

* cited by examiner

SEMICONDUCTOR SUBSTRATE FOR AN OPTICAL RECEIVER

CROSS REFERENCE TO RELATED APPLICATION

The present application is a national phase entry under 35 U.S.C. §371 of International Application No. PCT/US2011/064026, filed Dec. 8, 2011, entitled "SEMICONDUCTOR SUBSTRATE FOR AN OPTICAL RECEIVER," which designates, among the various States, the United States of America, and the contents and disclosures of which are hereby incorporated by reference in their entireties.

FIELD

Embodiments of the present disclosure generally relate to the field of integrated circuits, and more particularly, to semiconductor substrate techniques and configurations for an optical receiver.

BACKGROUND

Generally, optical components of an opto-electronic system such as laser, optical fiber, and photodetector are aligned to ensure that light signals are successfully transmitted/received between optical components. Current alignment techniques may require substantial time and/or resources due to tight alignment tolerance. For example, active alignment may be used to position optical components relative to one another while reception of light signals at a target device is measured. The optical components may be moved until the received light signals meet pre-determined specification metrics or values indicating proper alignment. The shrinking of photodetector active areas that are configured to receive transmitted light (e.g., carrying high data rate signals) may further complicate the alignment and/or assembly of optical receiver assemblies and systems using current techniques.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

Figure 1:
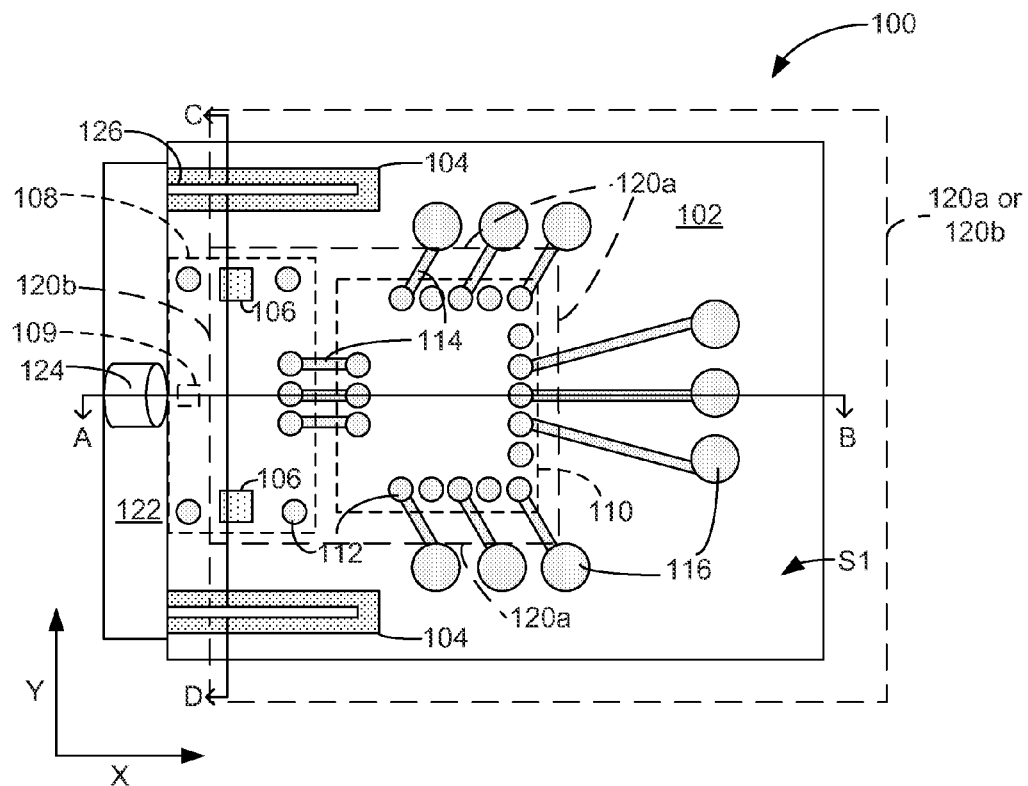
FIG. 1 schematically illustrates a top view of an example optical receiver system using a semiconductor substrate.

Embodiments of the present disclosure describe semiconductor substrate techniques and configurations for an optical receiver. The semiconductor substrate may facilitate alignment between components of an optical receiver system. In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

Various operations are described as multiple discrete operations in turn, in a manner that is most helpful in understanding the claimed subject matter. However, the order of description should not be construed as to imply that these operations are necessarily order dependent.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use perspective-based descriptions such as top/bottom, over/under, front, side, vertical/horizontal. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous. The term "coupled" may refer to a direct connection, an indirect connection, or an indirect communication.

As used herein, the term "module" may refer to, be part of, or include an Application Specific Integrated Circuit (ASIC), an electronic circuit, a processor (shared, dedicated, or group) and/or memory (shared, dedicated, or group) that execute one or more software or firmware programs, a combinational logic circuit, and/or other suitable components that provide the described functionality According to various embodiments, the present disclosure provides a system including a semiconductor substrate having one or more optical alignment features formed in a surface of the semiconductor substrate and an optical receiver assembly coupled with the semiconductor substrate, the optical receiver assembly including a photodetector device coupled with the surface of the semiconductor substrate, wherein the one or more optical alignment features facilitate precise optical alignment between a lens assembly and the photodetector device when the lens assembly is coupled with the semiconductor substrate using the one or more optical alignment features.

In some embodiments, the one or more optical alignment features include a first feature and a second feature, the photodetector device being disposed between the first feature and the second feature. In some embodiments, the one or more optical alignment features include a V-groove or U-groove channel formed in the semiconductor substrate.

In some embodiments, the system includes one or more hard stop structures formed on the surface of the semiconductor substrate, the one or more hard stop structures having a height from the surface of the semiconductor surface that provides precise positioning of the photodetector device relative to the semiconductor substrate in a vertical direction, the one or more hard stop structures being disposed between the photodetector device and the semiconductor substrate, the vertical direction being substantially perpendicular to the surface of the semiconductor substrate.

In some embodiments, the semiconductor substrate is composed of silicon and the one or more hard stop structures include silicon, silicon oxide ($SiO_2$), or silicon nitride (SiN).

In some embodiments, the optical receiver assembly further includes a receiver integrated circuit (RXic) device, the photodetector device and the optical receiver assembly are mounted on the semiconductor substrate using electrical interconnect structures, the photodetector device is electrically coupled with the RXic device using one or more trace structures formed on the surface of the semiconductor substrate, and the photodetector device is adjacent to a terminating edge of the semiconductor substrate.

In some embodiments, the electrical interconnect structures are first interconnect structures and the one or more trace structures include one of a microstrip line or coplanar waveguide. The system may further include a printed circuit board coupled with the surface of the semiconductor substrate using second electrical interconnect structures.

In some embodiments, the printed circuit board includes a portion that is recessed or removed, the portion being disposed over the photodetector device and/or RXic device to provide clearance for the photodetector device and/or the RXic device in a direction that is substantially perpendicular to the surface of the semiconductor substrate.

In some embodiments, the system further includes the lens assembly, wherein the lens assembly includes one or more alignment features that correspond with the one or more optical alignment features formed in the surface of the semiconductor substrate. In some embodiments, the lens assembly includes fiber optic components and the one or more optical alignment features of the lens assembly include one or more pin structures.

In some embodiments, the photodetector device is configured to receive light from the lens assembly in a direction that is parallel to the surface of the semiconductor substrate.

In some embodiments, the lens assembly includes a reflective surface to redirect light at a 90 degree angle and the photodetector device is configured to receive light from the lens assembly in a direction that is perpendicular to the surface of the semiconductor substrate.

In some embodiments, the semiconductor substrate includes a recessed portion formed into a terminating edge of the semiconductor substrate, the recessed portion being disposed adjacent to and under the photodetector device and configured to serve as a lateral hard stop for alignment of the lens assembly in a direction that is parallel to the surface of the semiconductor substrate.

According to various embodiments, the present disclosure describes a method including providing a semiconductor substrate having one or more optical alignment features formed in a surface the semiconductor substrate and coupling an optical receiver assembly including a photodetector device to the surface of the semiconductor substrate, wherein the one or more optical alignment features facilitate precise optical alignment between a lens assembly and the photodetector device when the lens assembly is coupled with the semiconductor substrate using the one or more optical alignment features.

In some embodiments, the one or more optical alignment features include a plurality of V-groove or U-groove channels formed in the surface of the semiconductor substrate and the photodetector device is disposed between a pair of the plurality of V-groove or U-groove channels.

In some embodiments, the provided semiconductor substrate includes one or more hard stop structures formed on the surface of the semiconductor substrate, the one or more hard stop structures having a height from the surface of the semiconductor surface that provides precise positioning of the photodetector device relative to the semiconductor substrate in a vertical direction during said coupling the optical receiver assembly to the semiconductor substrate, the vertical direction being substantially perpendicular to the surface of the semiconductor substrate. The one or more hard stop structures may be disposed between the photodetector device and the semiconductor substrate and the semiconductor substrate may be composed of silicon and the one or more hard stop structures may include silicon, silicon oxide ($SiO_2$), or silicon nitride (SiN).

In some embodiments, the optical receiver assembly further includes a receiver integrated circuit (RXic) device and said coupling the optical receiver assembly to the semiconductor substrate includes mounting the photodetector device and the optical receiver assembly on the semiconductor substrate using a solder reflow or thermocompression process and the photodetector device is electrically coupled with the RXic device using one or more trace structures formed on the surface of the semiconductor substrate.

In some embodiments, the method further includes coupling a printed circuit board to the surface of the semiconductor substrate. In some embodiments, the printed circuit board is coupled with the surface of the semiconductor substrate using a solder reflow process, the printed circuit board includes a portion that is recessed or removed, and said coupling the printed circuit board to the surface of the semiconductor substrate is performed such that the recessed or removed portion of the printed circuit board is disposed over the photodetector device and/or RXic device to provide clearance for the photodetector device and/or the RXic device in a direction that is substantially perpendicular to the surface of the semiconductor substrate.

In some embodiments, the method further includes coupling the lens assembly to the semiconductor substrate using the one or more optical alignment features, wherein the lens assembly includes one or more alignment features that correspond with the one or more optical alignment features formed in the surface of the semiconductor substrate, and wherein the one or more alignment features of the lens assembly are positioned to mate with the one or more optical alignment features formed in the surface of the semiconductor substrate.

In some embodiments, the lens assembly includes fiber optic components, the one or more alignment features of the lens assembly include one or more pin structures, and the lens assembly is coupled with the semiconductor substrate using an adhesive.

In some embodiments, the lens assembly is coupled with the semiconductor substrate such that the photodetector device is configured to receive light from the lens assembly in a direction that is parallel to the surface of the semiconductor substrate.

In some embodiments, the lens assembly includes a reflective surface to redirect light at a 90 degree angle and the lens assembly is coupled with the semiconductor substrate such that the photodetector device is configured to receive light from the lens assembly in a direction that is perpendicular to the surface of the semiconductor substrate.

In some embodiments, the semiconductor substrate includes a recessed portion formed into a terminating edge of the semiconductor substrate, the recessed portion being disposed adjacent to the photodetector device and configured to serve as a lateral hard stop when the lens assembly is coupled with the semiconductor substrate for precise positioning of the lens assembly in a direction that is parallel to the surface of the semiconductor substrate.

According to various embodiments, the present disclosure describes a semiconductor substrate having one or more optical alignment features formed into a surface of the semiconductor substrate and one or more hard stop structures formed on the surface of the semiconductor substrate, the one or more hard stop structures having a height from the surface of the semiconductor surface that provides precise positioning of a photodetector device relative to the semiconductor substrate in a vertical direction when the photodetector device is mounted on the semiconductor substrate and structurally supported by the one or more hard stop structures, the vertical direction being substantially perpendicular to the surface of the semiconductor substrate, wherein the one or more optical alignment features facilitate precise optical alignment between a lens assembly and the photodetector device when the lens assembly is coupled with the semiconductor substrate using the one or more optical alignment features.

In some embodiments, the one or more optical alignment features include a first feature and a second feature such that the photodetector device, when mounted, is disposed between the first feature and the second feature. In some embodiments, the one or more optical alignment features include a V-groove or U-groove channel formed in the semiconductor substrate.

In some embodiments, the semiconductor substrate is a micro-machined substrate composed of silicon and the one or more hard stop structures include silicon, silicon oxide ($SiO_2$), or silicon nitride (SiN).

In some embodiments, the semiconductor substrate, further includes a recessed portion formed into a terminating edge of the semiconductor substrate, the recessed portion being configured to serve as a lateral hard stop for precise positioning of the lens assembly in a horizontal direction when the lens assembly is coupled with the semiconductor substrate, the horizontal direction being parallel to the surface of the semiconductor substrate FIG. 1 schematically illustrates a top view of an example optical receiver system 100 using a semiconductor substrate 102. The optical receiver system 100 may include the semiconductor substrate 102 and one or more components of an optical receiver assembly coupled with a surface, S1, of the semiconductor substrate 102. The components of the optical receiver assembly may, for example, include, a photodetector device 108 having one or more photodetector elements (hereinafter "photodetector element 109") that are configured to receive light (e.g., optical signals) and a receiver integrated circuit (RXic) device 110 that may include a transimpedance amplifier (TIA), limiting amplifiers, output driver, and/or other electronics. The photodetector device 108 and the RXic device 110 are depicted in dashed form to indicate that they overlie the semiconductor substrate 102 and are transparent to avoid obscuring underlying elements.

The components of the optical receiver assembly (e.g., the photodetector device 108 and the RXic device 110) may be coupled with the surface S1 of the semiconductor substrate 102 using interconnect structures 112. The interconnect structures 112 may include, for example, electrically conductive structures such as bumps, posts, or any other suitable structure for mounting or bonding the components to the semiconductor substrate 102. The interconnect structures 112 may include, for example, compressible solder pads, which may facilitate sub-micron precision in defining the height of the photodetector device 108 in the Z-direction. In some embodiments, the interconnect structures 112 are first-level interconnects. The photodetector device 108 may be electrically coupled with the RXic device 110 using trace structures 114 formed on the surface S1 of the semiconductor substrate 102. The trace structures 114 may include, for example, fan-out traces, coplanar waveguides, microstrip lines and/or bondpads that enable high-frequency signal conduction for the optical receiver system 100. In some embodiments, the photodetector device 108 is positioned adjacent to a terminating edge of the semiconductor substrate 102, as can be seen in FIG. 1.

Figure 3:
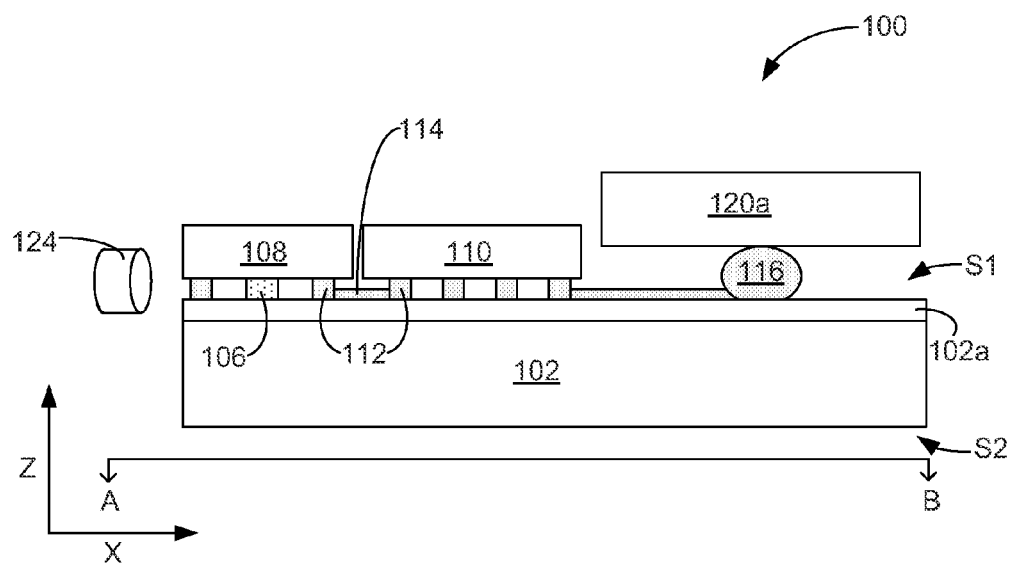
FIG. 3 schematically illustrates another cross-section side view of the example optical receiver system of FIG. 1, in accordance with some embodiments.

The optical receiver system 100 may further include a printed circuit board 120a or 120b (may be referred to as "package substrate") coupled with the semiconductor substrate 102. The printed circuit board 120a is configured according to a first embodiment where a portion of the printed circuit board 120a is recessed or removed over the photodetector device 108 and/or RXic device 110 to provide clearance for the photodetector device 108 and/or the RXic device 110 in a direction (e.g., Z-direction of FIG. 3) that is substantially perpendicular to the surface S1 of the semiconductor substrate. The printed circuit board 120a is also depicted in FIG. 3.

Figure 2:
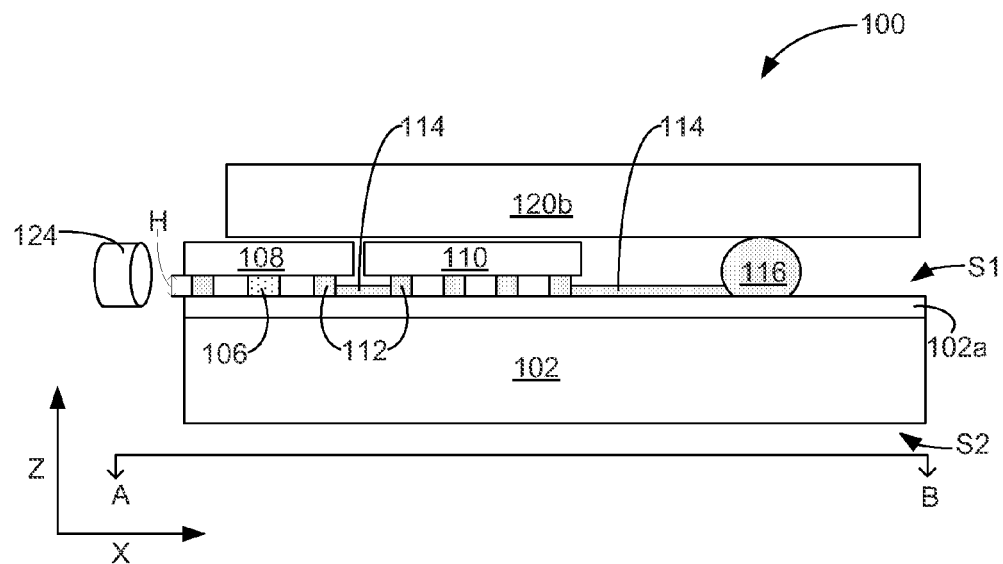
FIG. 2 schematically illustrates a cross-section side view of the example optical receiver system of FIG. 1, in accordance with some embodiments.

The printed circuit board 120b is configured according to a second embodiment that does not include the recessed or removed portion of the printed circuit board 120a. The printed circuit board 120b is also depicted in FIG. 2.

The printed circuit board 120a or 120b may be coupled with the semiconductor substrate 102 using interconnect structures 116. The interconnect structures 116 may include electrically conductive structures such as, for example, solder balls or any other suitable structure to couple the printed circuit board 120a or 120b to the semiconductor substrate 102. In some embodiments, the interconnect structures 116 are second-level interconnects. The printed circuit board 120a or 120b may be electrically coupled with the components of the optical receiver assembly such as the photodetector device 108 and the RXic device 110 using trace structures 114 formed on the surface S1 of the semiconductor substrate 102. The interconnect structures 112, 116 and trace structures 114 may be composed of an electrically conductive material such as metal, solder, alloys, or combinations thereof. In some embodiments, the interconnect structures 112 may be composed of multiple layers of different metals such as aluminum, gold, tin or lead solder, copper, and the like. Other metals or other electrically conductive materials may be used to fabricate the interconnect structures 112 in other embodiments. The interconnect structures 116 and/or trace structures may be coupled microstrip lines, coplanar waveguides, or something similar, in some embodiments.

The semiconductor substrate 102 may include a precision-micromachined substrate composed of silicon (Si) in some embodiments. The semiconductor substrate 102 may include other semiconductor materials in other embodiments. The semiconductor substrate 102 may include one or more features that facilitate and/or allow precise positioning of optical components relative to one another. For example, in some embodiments, the semiconductor substrate 102 may include one or more optical alignment features 104 and/or hard stop features (e.g., one or more vertical hard stop structures 106) that facilitate precise assembly and/or alignment for components of the optical receiver system 100.

The one or more optical alignment features 104 (hereinafter "optical alignment features 104") may include, for example, one or more V-groove or U-groove channels formed into the surface S1 of the semiconductor substrate 102. For example, the V-groove channel may refer to a channel having a V-shaped profile (e.g., as can be seen in the optical alignment features 104 of FIG. 4). The U-groove channel may refer to a channel having a U-shaped or rectangular profile. Other channel shapes may be used in other embodiments.

The optical alignment features 104 may facilitate precise optical alignment between a lens assembly 122 and components of the optical receiver assembly disposed on the surface S1 of the semiconductor substrate 102 when the lens assembly 122 is coupled with the semiconductor substrate using the optical alignment features 104. The lens assembly 122 may include fiber optic components that route light from a transmission source to an optical output 124 that is configured to output light from the lens assembly 122 to the photodetector element 109 of the photodetector device 108. Precise alignment between the optical output 124 and the photodetector element 109 of the photodetector device 108 may be needed for transmission of optical signals between the lens assembly 122 and the photodetector device 108.

In some embodiments, the lens assembly 122 may include one or more alignment features 126 (hereinafter "alignment features 126") that correspond with the optical alignment features 104 formed in the surface S1 of the semiconductor substrate 102. The alignment features 126 may include, for example, one or more pin structures. Other types of structures may be used in other embodiments. The alignment features 126 may be inserted or otherwise positioned in or coupled with the optical alignment features 104 such that the optical output 124 of the lens assembly 122 is aligned to transmit light to the photodetector element 109 of the photodetector device 108.

In some embodiments, the optical alignment features 104 provide precise alignment in the Y-direction and in the Z-direction (e.g., the Z-direction of FIG. 2) for the lens assembly 122 relative to the semiconductor substrate 102 and the photodetector device 108 mounted on the semiconductor substrate 102. In some embodiments, the optical alignment features 104 include at least a first feature and a second feature such that the photodetector device 108, when coupled with the semiconductor substrate 102, is disposed between the first feature and the second feature, as can be seen in FIG. 1. The optical alignment features 104 may be formed using conventional patterning techniques such as lithography and/or etching (e.g., deep reactive ion etching, or crystallographic etching using potassium hydroxide (KOH) or tetramethyl ammonium hydroxide (TMAH) or ammonium hydroxide (NH$_4$OH)) processes to selectively and precisely remove material of the semiconductor substrate 102.

The semiconductor substrate 102 may further include one or more hard stop structures such as, for example, one or more vertical hard stop structures 106 (hereinafter "vertical hard stop structures 106"). The vertical hard stop structures 106 may be formed to structurally support the photodetector device 108 during a process of attaching the photodetector device 108 to the semiconductor substrate 102 to ensure precise positioning of the photodetector device 108 relative to the semiconductor substrate 102. For example, the vertical hard stop structures 106 may have a height (e.g., height H of FIG. 2) from the surface S1 of the semiconductor substrate 102 that provides precise positioning of the photodetector device 108 relative to the semiconductor substrate 102 in the vertical direction (e.g., Z-direction of FIG. 2). The vertical direction may be substantially perpendicular to the surface S1 of the semiconductor substrate 102.

The vertical hard stop structures 106 may be disposed between the photodetector device 108 and the semiconductor substrate 102 when the photodetector device 108 is coupled with the semiconductor substrate 102. In some embodiments, the vertical hard stop structures 106 in combination with the optical alignment features 104 may facilitate precise alignment in the Z-direction of the optical output 124 of the lens assembly 122 relative to the photodetector element 109 of the photodetector device 108 to less than about 0.6 microns.

According to various embodiments, the vertical hard stop structures 106 may be formed using conventional patterning processes such as etch and/or lithography techniques to selectively remove material of the semiconductor substrate 102. The vertical hard stop structures 106 may be composed of silicon (Si), silicon oxide (SiO$_2$), or silicon nitride (SiN) in some embodiments. Other materials may be used to fabricate the vertical hard stop structures 106 in other embodiments. In some embodiments, the semiconductor substrate 102 is a silicon optical bench (SiOB).

FIG. 2 schematically illustrates a cross-section side view of the example optical receiver system 100 of FIG. 1, in accordance with some embodiments. For example, FIG. 2 may depict a cross-section of the optical receiver system 100 of FIG. 1 along line AB of FIG. 1 for the embodiment where the printed circuit board is schematically delineated by 120b. FIG. 2 depicts only the optical output 124 of the lens assembly 122 of FIG. 1 for the sake of clarity.

In some embodiments, the surface S1 of the semiconductor substrate 102 includes an electrically insulative layer 102a formed on the semiconductor substrate 102. The electrically insulative layer 102a may, for example, be composed of SiO2 or SiN in some embodiments. The semiconductor substrate 102 may include another surface, S2, that is disposed opposite to the surface S1. The photodetector device 108 and the RXic device 110 are mounted on the semiconductor substrate 102 using interconnect structures 116. Vertical hard stop structures 106 are disposed between the photodetector device 108 and the semiconductor substrate 102. Trace structures 114 electrically couple the photodetector device 108 and the RXic device 110 to printed circuit board 120b via interconnect structures 116.

The printed circuit board 120b is mounted on the semiconductor substrate 102 using interconnect structures 116. As can be seen, in one embodiment, the printed circuit board 120b is disposed over the photodetector device 108 and the RXic device 110. The photodetector device 108 and the RXic device 110 may be disposed between the printed circuit board 120b and the semiconductor substrate 102. The photodetector device 108 and the RXic device 110 may be thinned to fit between the printed circuit board 120b and the semiconductor substrate 102.

FIG. 3 schematically illustrates another cross-section side view of the example optical receiver system 100 of FIG. 1, in accordance with some embodiments. For example, FIG. 3 may depict a cross-section of the optical receiver system 100 of FIG. 1 along line AB of FIG. 1 for the embodiment where the printed circuit board is schematically delineated by 120a. FIG. 3 depicts only the optical output 124 of the lens assembly 122 of FIG. 1 for the sake of clarity.

In the depicted configuration, the printed circuit board 120a does not overlie the photodetector device 108 and the RXic device 110. The printed circuit board 120a includes a cut-out or recessed region or otherwise provides a region to accommodate the photodetector device 108 and the RXic device 110 as can be seen.

Figure 4:
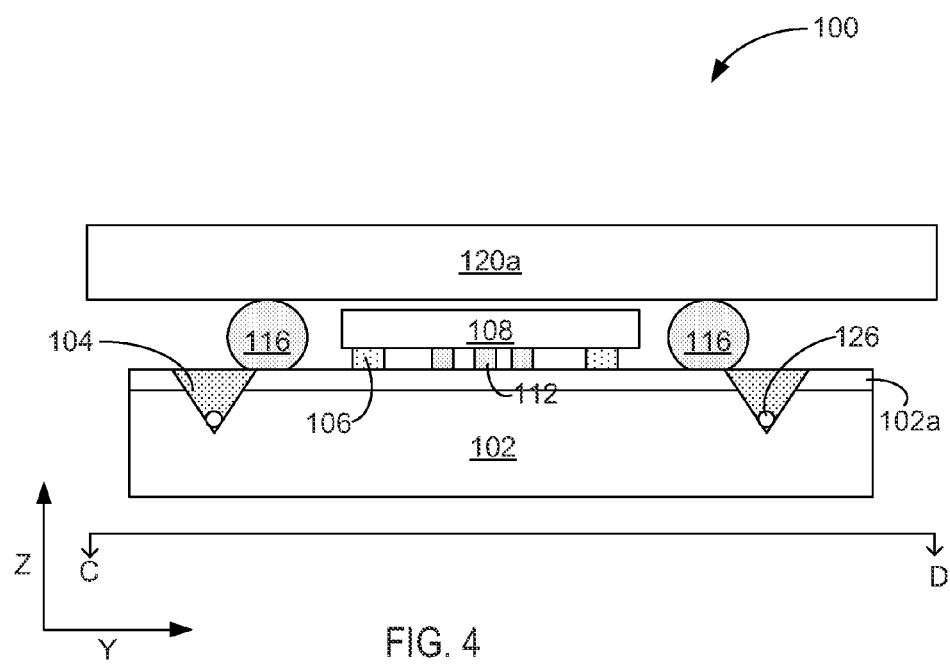
FIG. 4 schematically illustrates a cross-section front view of the example optical receiver system of FIG. 1, in accordance with some embodiments.

FIG. 4 schematically illustrates a cross-section front view of the example optical receiver system 100 of FIG. 1, in accordance with some embodiments. For example, FIG. 4 may depict a cross-section of the optical receiver system 100 of FIG. 1 along line CD of FIG. 1.

The semiconductor substrate 102 includes optical alignment features 104. Corresponding alignment features 126 of the lens assembly 122 are coupled with or positioned to mate with the optical alignment features 104.

The photodetector device 108 is coupled with the semiconductor substrate 102 using interconnect structures 112. The semiconductor substrate 102 includes vertical hard stop structures 106 to ensure precise positioning of the photodetector device 108 relative to the semiconductor substrate in the Z-direction. The printed circuit board 120a is coupled with the semiconductor substrate 102 using interconnect structures 116.

Figure 5:
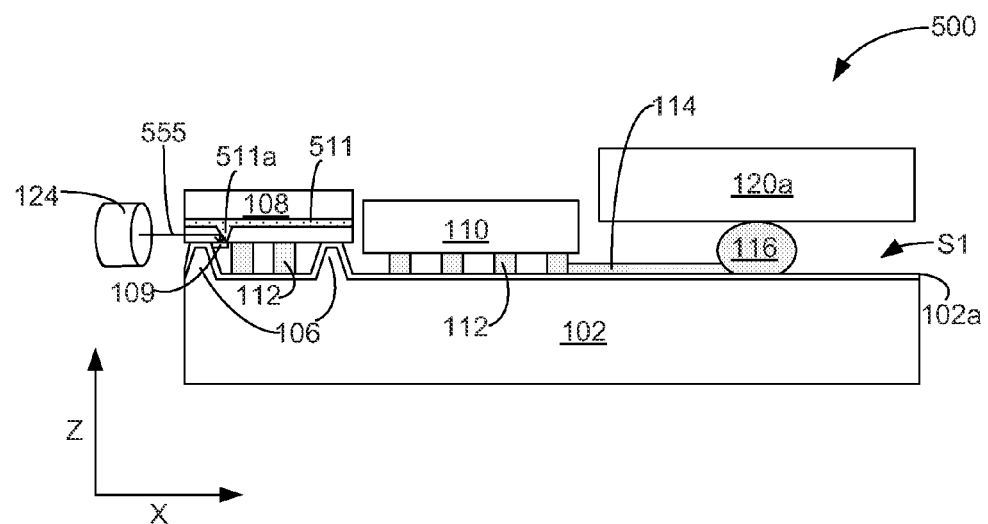
FIG. 5 schematically illustrates a cross-section side view of an example optical receiver system using a semiconductor substrate, in accordance with some embodiments.

FIG. 5 schematically illustrates a cross-section side view of an example optical receiver system 500 using a semiconductor substrate 102, in accordance with some embodiments. The view and optical receiver system 500 of FIG. 5 may be similar to the view and optical receiver system 100 of FIG. 3.

The optical receiver system 500 includes a semiconductor substrate 102 having one or more optical alignment features 104 formed on surface S1 of the semiconductor substrate 102. The semiconductor substrate 102 may include an electrically insulative layer 102a.

According to various embodiments, the photodetector device 108 is configured to receive light from the lens assembly (e.g., from optical output 124) in a direction that is parallel to the surface S1 of the semiconductor substrate 102. For example, the depicted X-direction is parallel to the surface S1 of the semiconductor substrate 102. According to various embodiments, the photodetector device 108 is a re-entrant mirror (REM) photodetector 108. The photodetector device 108 may include a waveguide (e.g., a Si waveguide defined by $SiO_2$ layer 511 and structure 511a) that is configured to redirect light 555 output by the optical output 124 to a photodetector element 109 of the photodetector device 108. The light may be redirected by the waveguide, for example, by about 70 to 110 degrees in some embodiments. In other embodiments, the photodetector device 108 may be configured to receive light from the lens assembly in a direction that is perpendicular to the surface S1 of the semiconductor substrate.

Figure 6:
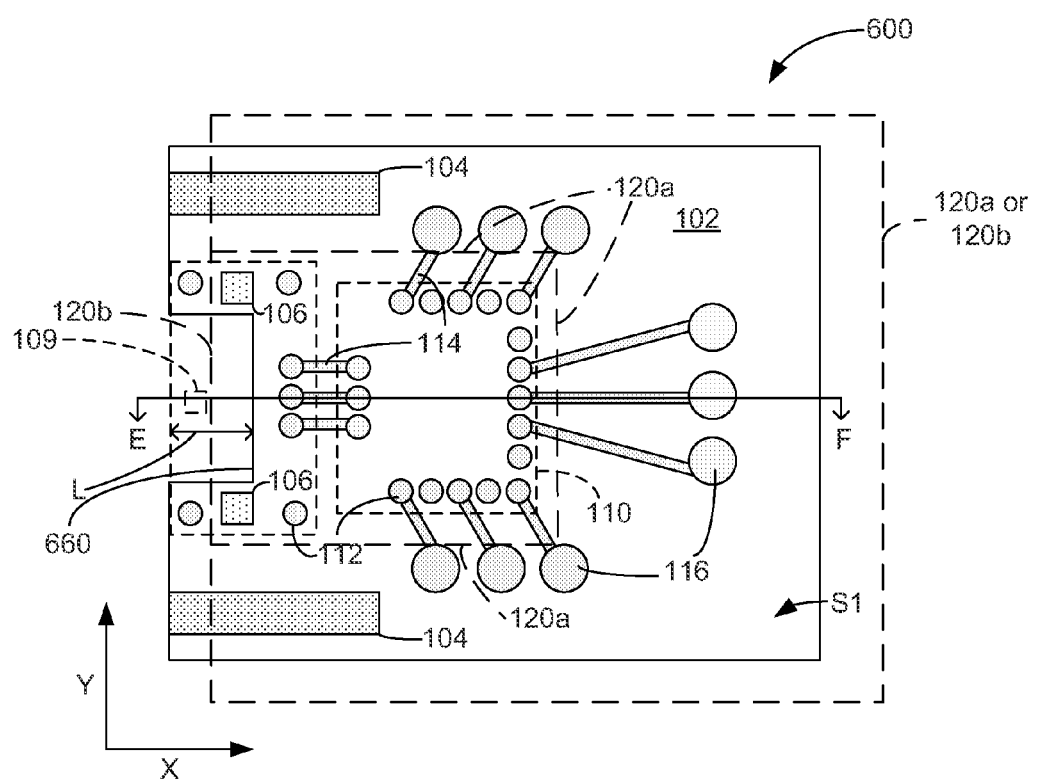
FIG. 6 schematically illustrates a top view of an example optical receiver system using a semiconductor substrate, in accordance with some embodiments.

FIG. 6 schematically illustrates a top view of an example optical receiver system 600 using a semiconductor substrate 102, in accordance with some embodiments. The semiconductor substrate 102 includes a lateral hard stop structure 660 to facilitate precise assembly and/or alignment between components of the optical receiver system 600. A lens assembly (e.g., optical output 724 of FIG. 7) is omitted in FIG. 6 for the sake of clarity.

The lateral hard stop structure 660 may provide a recessed or cut-out portion of the semiconductor substrate 102 that allows the optical output (e.g., optical output 724 of FIG. 7) of a lens assembly to be precisely positioned directly under the photodetector device 108. For example, the lateral hard stop structure 660 may have an edge that is recessed a distance, L, in the X-direction from a terminating edge of the semiconductor substrate 102, as can be seen. The lateral hard stop structure 660 may facilitate precise alignment of the lens assembly (e.g., optical output 724 of FIG. 7) relative to the semiconductor substrate 102 and the photodetector device 108 in the X-direction. For example, the optical output or other component of the lens assembly may be positioned directly against the lateral hard stop structure 660 for coupling with the semiconductor substrate.

The lateral hard stop structure 660 can be formed according to a variety of suitable techniques including, for example, patterning processes such as etch or lithography processes. In some embodiments, the lateral hard stop structure 660 may facilitate precise alignment in the X-direction of the optical output (e.g., optical output 724 of FIG. 7) relative to the photodetector element 109 of the photodetector device 108 to less than about 0.6 microns.

Figure 7:
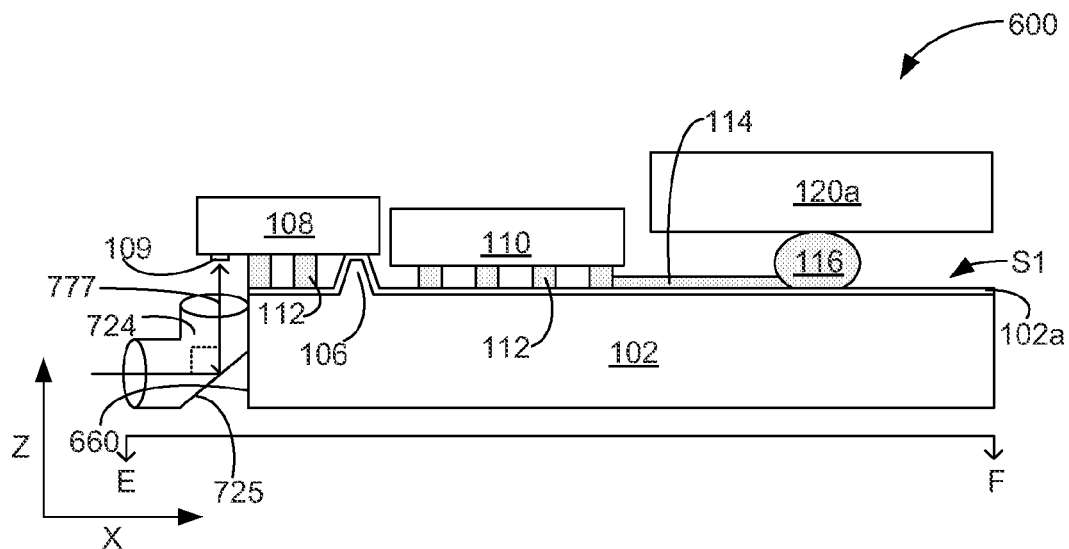
FIG. 7 schematically illustrates a cross-section side view of the example optical receiver system of FIG. 6, in accordance with some embodiments.

FIG. 7 schematically illustrates a cross-section side view of the example optical receiver system 600 of FIG. 6, in accordance with some embodiments. For example, FIG. 7 may depict a cross-section of the optical receiver system 600 of FIG. 6 along line EF of FIG. 6. FIG. 7 further depicts an optical output 724 of a lens assembly (e.g., lens assembly 122 of FIG. 1).

The lateral hard stop structure 660 is recessed to allow a component of the lens assembly (e.g., optical output 724 of FIG. 7) to structurally abut the semiconductor substrate 102 directly under at least a portion of the photodetector device 108. The optical output 724 may include a reflective surface 725 (e.g., mirror) that is configured to redirect light 777 (e.g., at a 90 degree angle or other angle). The photodetector device 108 may be configured such that the photodetector element receives the light 777 from the lens assembly in a direction (e.g., Z-direction) that is perpendicular to the surface S1 of the semiconductor substrate 102. According to various embodiments, the photodetector device 108 is a normal-incidence photodetector (NIPD). The embodiments described in connection with FIGS. 1-7 may be combined in some embodiments.

Figure 8:
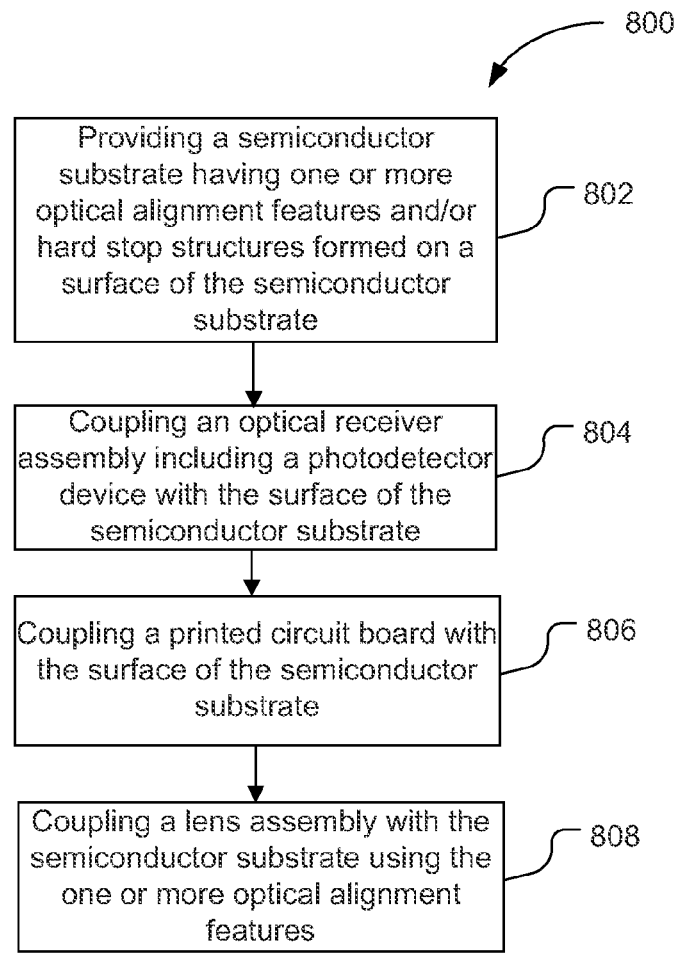
FIG. 8 is a flow diagram for a method of fabricating an optical receiver system, in accordance with some embodiments.

FIG. 8 is a flow diagram for a method 800 of fabricating an optical receiver system (e.g., optical receiver system 100 or 600 of respective FIG. 1 or 6), in accordance with some embodiments. The method 800 may comport with techniques described in connection with FIGS. 1-7 in some embodiments.

At 802, the method 800 includes providing a semiconductor substrate (e.g., semiconductor substrate 102 of FIG. 1) having one or more optical alignment features (e.g., optical alignment features 104 of FIG. 1) and/or hard stop structures (e.g., vertical hard stop structures 106 of FIG. 1) on a surface (e.g., surface S1 of FIG. 1) of the semiconductor substrate. The semiconductor substrate may further include a lateral hard stop structure (e.g., lateral hard stop structure 660 of FIG. 6) formed in a terminating edge of the semiconductor substrate. The one or more optical alignment features and/or hard stop structures may be formed using conventional submicron patterning techniques such as etch or lithography processes used to precisely pattern silicon or other semiconductor materials in semiconductor manufacturing processes.

At 804, the method 800 further includes coupling an optical receiver assembly including a photodetector device (e.g., photodetector device 108 of FIG. 1) to the surface of the semiconductor substrate. The optical receiver assembly may further include a RXic device (e.g., RXic device 110 of FIG. 1). The components of the optical receiver assembly (e.g., the photodetector device and the RXic device) may be mounted on the surface of the semiconductor substrate using, for example, a solder reflow process or thermocompression process to bond interconnect structures (e.g., interconnect structures 112 of FIG. 1) to the components and/or the semiconductor substrate. The photodetector device may be positioned on the vertical hard stop structure using a bonding tool and subjected to a bonding process. The vertical hard stop structures may facilitate precise positioning of the photodetector device relative to the semiconductor substrate.

At 806, the method 800 further includes coupling a printed circuit board (e.g., printed circuit board 120a or 120b of FIG. 1) to the surface of the semiconductor substrate. The printed circuit board may be coupled with the semiconductor substrate using, for example, a solder reflow process or thermocompression process that bonds interconnect structures (e.g., interconnect structures 116) to the printed circuit board and/or the semiconductor substrate.

At 808, the method 800 further includes coupling a lens assembly (e.g., lens assembly 122 including optical output 124) to the semiconductor substrate using the one or more optical alignment features. The lens assembly may include one or more corresponding alignment features (e.g., alignment features 126 of FIG. 1) that are configured to mate with the one or more optical alignment features. The alignment features may be positioned in the one or more optical alignment features to ensure precise alignment between the lens assembly and the semiconductor substrate. The lens assembly may be coupled with the semiconductor substrate using an adhesive. The positioning and the coupling may occur simultaneously or in sequential order.

In some embodiments, the semiconductor substrate may include a lateral hard stop feature. The lens assembly may be positioned to abut the lateral hard stop feature in some embodiments.

Figure 9:
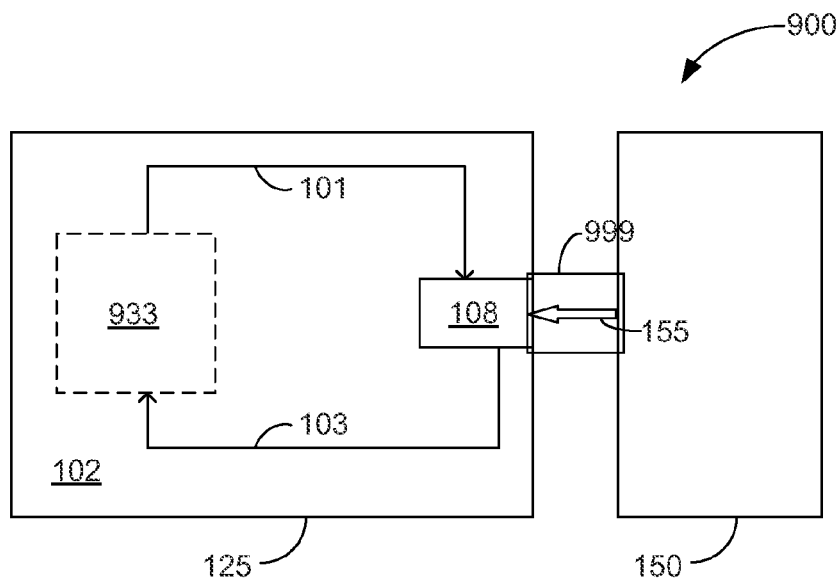
FIG. 9 schematically illustrates an example optical interconnect system.

FIG. 9 schematically illustrates an example optical interconnect system. The optical interconnect system 900 may include a first processor-based system 125 and a second processor-based system 150 optically coupled together using one or more optical coupling elements 999. The one or more optical coupling elements 999 can include, for example, a lens assembly (e.g., lens assembly 122 of FIG. 1) including fiber optic components and/or waveguides, but is not limited to these examples. The one or more optical coupling elements 999 may provide an optical pathway for optical signals in the form of light 155 that are sent or received between the first processor-based system 125 and the second processor-based system 150.

In an embodiment, the first processor-based system 125 includes a photodetector device 108 mounted on a semiconductor substrate 102. The photodetector device 108 may include one or more optical apertures (e.g., photodetector element 109 of FIG. 1) that are configured to receive the light 155.

The first processor-based system 125 may further include a processor 933, which is indicated in dashed form to indicate that the processor 933 may or may not be mounted on the semiconductor substrate 102. For example, the processor 933 may be mounted on another substrate (e.g., printed circuit board 120a or 120b) that is operatively coupled with the semiconductor substrate and/or the photodetector device 108. The processor 933 may be operatively coupled (e.g., arrows 101 and 103) with the photodetector device 108 to control or respond to reception of optical signals (e.g., light 155) from the second processor-based system 150. In some embodiments, the processor 933 may be a central processing unit (CPU) or is composed of several processors. Although not shown, the second processor-based system 150 may be similarly equipped as the first processor-based system 125.

The first processor-based system 125 and/or the second processor-based system 150 may include additional components in some embodiments. For example, the first processor-based system 125 and/or the second processor-based system 150 may comport with embodiments described in connection with the example processor-based system 1000 of FIG. 10.

Figure 10:
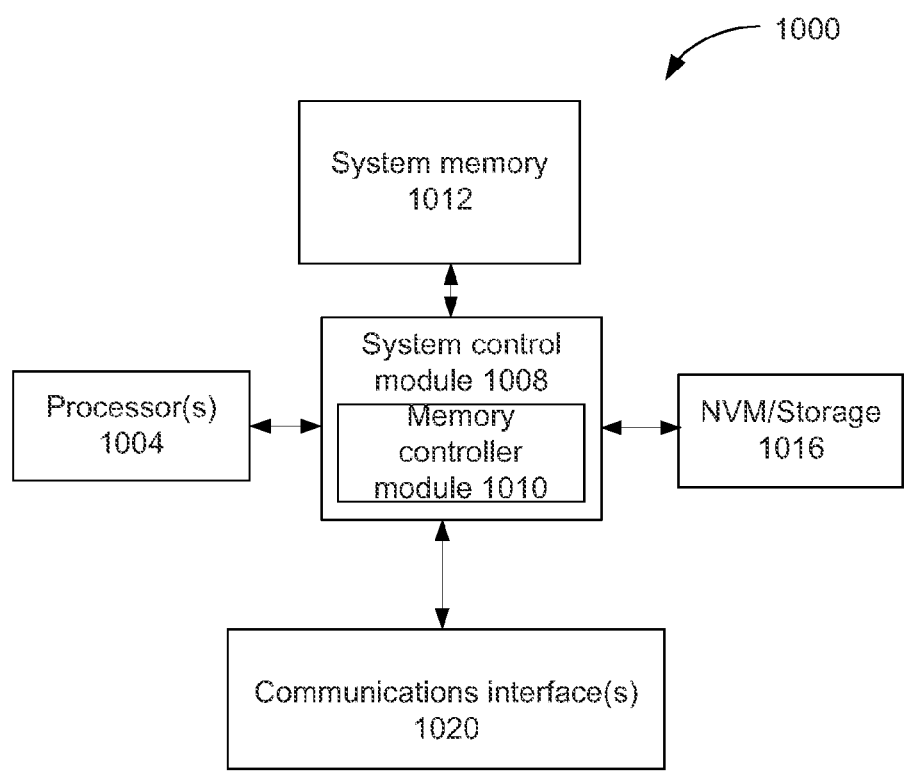
FIG. 10 schematically illustrates an example processor-based system that may be part of or may include an optical interconnect system described herein in accordance with some embodiments.

Embodiments of the present disclosure may be implemented into a system using any suitable hardware and/or software to configure as desired. FIG. 10 schematically illustrates an example processor-based system 1000 (hereinafter "system 1000") that may be part of or may include an optical interconnect system 900 described herein in accordance with some embodiments. In one embodiment, the system 1000 includes one or more processor(s) 1004. One of the one or more processor(s) 1004 may correspond, for example, with the processor 933 of FIG. 9.

The system 1000 may further include system control module 1008 coupled with at least one of the processor(s) 1004, system memory 1012 coupled with system control module 1008, non-volatile memory (NVM)/storage 1016 coupled with system control module 1008, and one or more communications interface(s) 1020 coupled with system control module 1008.

System control module 1008 for one embodiment may include any suitable interface controllers to provide for any suitable interface to at least one of the processor(s) 1004 and/or to any suitable device or component in communication with system control module 1008.

System control module 1008 may include a memory controller module 1010 to provide an interface to system memory 1012. The memory controller module 1010 may be a hardware module, a software module, and/or a firmware module.

System memory 1012 may be used to load and store data and/or instructions, for example, for system 1000. System memory 1012 for one embodiment may include any suitable volatile memory, such as suitable Dynamic Random Access Memory (DRAM), for example.

System control module 1008 for one embodiment may include one or more input/output (I/O) controller(s) to provide an interface to NVM/storage 1016 and communications interface(s) 1020.

The NVM/storage 1016 may be used to store data and/or instructions, for example. NVM/storage 1016 may include any suitable non-volatile memory, such as Phase Change Memory (PCM) or flash memory, for example, and/or may include any suitable non-volatile storage device(s), such as one or more hard disk drive(s) (HDD(s)), one or more compact disc (CD) drive(s), and/or one or more digital versatile disc (DVD) drive(s), for example.

The NVM/storage 1016 may include a storage resource physically part of a device on which the system 1000 is installed or it may be accessible by, but not necessarily a part of, the device. For example, the NVM/storage 1016 may be accessed over a network via the communications interface(s) 1020.

Communications interface(s) 1020 may provide an interface for system 1000 to communicate over one or more wired or wireless network(s) and/or with any other suitable device.

For one embodiment, at least one of the processor(s) 1004 may be packaged together with logic for one or more controller(s) of system control module 1008, e.g., memory controller module 1010. For one embodiment, at least one of the processor(s) 1004 may be packaged together with logic for one or more controllers of system control module 1008 to form a System in Package (SiP). For one embodiment, at least one of the processor(s) 1004 may be integrated on the same die with logic for one or more controller(s) of system control module 1008. For one embodiment, at least one of the processor(s) 1004 may be integrated on the same die with logic for one or more controller(s) of system control module 1008 to form a System on Chip (SoC).

In various embodiments, the system 1000 may be, but is not limited to, a server, a workstation, a desktop computing device, or a mobile computing device (e.g., a laptop computing device, a handheld computing device, a handset, a tablet, a smartphone, a netbook, etc.). In various embodiments, the system 1000 may have more or less components, and/or different architectures.

Although certain embodiments have been illustrated and described herein for purposes of description, a wide variety of alternate and/or equivalent embodiments or implementations calculated to achieve the same purposes may be substituted for the embodiments shown and described without departing from the scope of the present disclosure. This application is intended to cover any adaptations or variations of the embodiments discussed herein. Therefore, it is manifestly intended that embodiments described herein be limited only by the claims and the equivalents thereof.

What is claimed is:

1. A system comprising:
   a semiconductor substrate having one or more optical alignment features formed in a surface of the semiconductor substrate; and
   an optical receiver assembly coupled with the semiconductor substrate, the optical receiver assembly including a photodetector device coupled with the surface of the semiconductor substrate, wherein the one or more optical alignment features facilitate precise optical alignment between a lens assembly and the photodetector device when the lens assembly is coupled with the semiconductor substrate using the one or more optical alignment features, wherein the semiconductor substrate includes a recessed portion formed into a terminating edge of the semiconductor substrate, the recessed portion being disposed adjacent to and under the photodetector device and configured to serve as a lateral hard stop for alignment of the lens assembly in a direction that is parallel to the surface of the semiconductor substrate.

2. The system of claim 1, wherein the one or more optical alignment features include a first feature and a second feature, the photodetector device being disposed between the first feature and the second feature, wherein the one or more optical alignment features include a V-groove or U-groove channel formed in the semiconductor substrate.

3. The system of claim 1, further comprising:
   one or more hard stop structures formed on the surface of the semiconductor substrate, the one or more hard stop structures having a height from the surface of the semiconductor substrate that provides precise positioning of the photodetector device relative to the semiconductor substrate in a vertical direction, the one or more hard stop structures being disposed between the photodetector device and the semiconductor substrate, the vertical direction being substantially perpendicular to the surface of the semiconductor substrate.

4. The system of claim 3, wherein the semiconductor substrate is composed of silicon and the one or more hard stop structures include silicon, silicon oxide ($SiO_2$), or silicon nitride (SiN).

5. The system of claim 1, wherein:
   the optical receiver assembly further includes a receiver integrated circuit (RXic) device;
   the photodetector device and the RXic device are mounted on the semiconductor substrate using electrical interconnect structures;
   the photodetector device is electrically coupled with the RXic device using one or more trace structures formed on the surface of the semiconductor substrate; and
   the photodetector device is adjacent to a terminating edge of the semiconductor substrate.

6. The system of claim 5, wherein the electrical interconnect structures are first interconnect structures and the one or more trace structures include one of a microstrip line or coplanar waveguide, the system further comprising:
   a printed circuit board coupled with the surface of the semiconductor substrate using second electrical interconnect structures.

7. The system of claim 6, wherein the printed circuit board includes a portion that is recessed or removed, the portion being disposed over the photodetector device and/or RXic device to provide clearance for the photodetector device and/or the RXic device in a direction that is substantially perpendicular to the surface of the semiconductor substrate.

8. The system of claim 1, further comprising:
   the lens assembly, wherein the lens assembly includes one or more alignment features that correspond with the one or more optical alignment features formed in the surface of the semiconductor substrate, wherein: the lens assembly includes fiber optic components and the one or more optical alignment features of the lens assembly include one or more pin structures.

9. The system of claim 8, wherein the photodetector device is configured to receive light from the lens assembly in a direction that is parallel to the surface of the semiconductor substrate.

10. The system of claim 8, wherein:
    the lens assembly includes a reflective surface to redirect light at a 90 degree angle; and
    the photodetector device is configured to receive light from the lens assembly in a direction that is perpendicular to the surface of the semiconductor substrate.

11. A method comprising:
    providing a semiconductor substrate having one or more optical alignment features formed in a surface the semiconductor substrate; and
    coupling an optical receiver assembly including a photodetector device to the surface of the semiconductor substrate, wherein the one or more optical alignment features facilitate precise optical alignment between a lens assembly and the photodetector device when the lens assembly is coupled with the semiconductor substrate using the one or more optical alignment features, wherein providing the semiconductor substrate includes forming a recessed portion in a terminating edge of the semiconductor substrate, the forming including disposing the recessed portion adjacent to and under the photodetector device, to serve as a lateral hard stop for alignment of the lens assembly in a direction that is parallel to the surface of the semiconductor substrate.

12. The method of claim 11, wherein:
the one or more optical alignment features include a plurality of V-groove or U-groove channels formed in the surface of the semiconductor substrate; and
the photodetector device is disposed between a pair of the plurality of V-groove or U-groove channels.

13. The method of claim 11, wherein:
the provided semiconductor substrate includes one or more hard stop structures formed on the surface of the semiconductor substrate, the one or more hard stop structures having a height from the surface of the semiconductor substrate that provides precise positioning of the photodetector device relative to the semiconductor substrate in a vertical direction during said coupling the optical receiver assembly to the semiconductor substrate, the vertical direction being substantially perpendicular to the surface of the semiconductor substrate;
the one or more hard stop structures are disposed between the photodetector device and the semiconductor substrate; and
the semiconductor substrate is composed of silicon and the one or more hard stop structures include silicon, silicon oxide ($SiO_2$), or silicon nitride (SiN).

14. The method of claim 11, wherein:
the optical receiver assembly further includes a receiver integrated circuit (RXic) device;
said coupling the optical receiver assembly to the semiconductor substrate includes mounting the photodetector device and the optical receiver assembly on the semiconductor substrate using a solder reflow or thermocompression process; and
the photodetector device is electrically coupled with the RXic device using one or more trace structures formed on the surface of the semiconductor substrate.

15. The method of claim 14, further comprising:
coupling a printed circuit board to the surface of the semiconductor substrate, wherein:
the printed circuit board is coupled with the surface of the semiconductor substrate using a solder reflow process;
the printed circuit board includes a portion that is recessed or removed; and
said coupling the printed circuit board to the surface of the semiconductor substrate is performed such that the recessed or removed portion of the printed circuit board is disposed over the photodetector device and/or RXic device to provide clearance for the photodetector device and/or the RXic device in a direction that is substantially perpendicular to the surface of the semiconductor substrate.

16. The method of claim 15, further comprising:
coupling the lens assembly to the semiconductor substrate using the one or more optical alignment features, wherein the lens assembly includes one or more alignment features that correspond with the one or more optical alignment features formed in the surface of the semiconductor substrate, and wherein the one or more alignment features of the lens assembly are positioned to mate with the one or more optical alignment features formed in the surface of the semiconductor substrate.

17. The method of claim 16, wherein:
the lens assembly includes fiber optic components;
the one or more alignment features of the lens assembly include one or more pin structures; and
the lens assembly is coupled with the semiconductor substrate using an adhesive.

18. The method of claim 16, wherein the lens assembly is coupled with the semiconductor substrate such that the photodetector device is configured to receive light from the lens assembly in a direction that is parallel to the surface of the semiconductor substrate.

19. The method of claim 16, wherein:
the lens assembly includes a reflective surface to redirect light at a 90 degree angle; and
the lens assembly is coupled with the semiconductor substrate such that the photodetector device is configured to receive light from the lens assembly in a direction that is perpendicular to the surface of the semiconductor substrate.

20. A semiconductor substrate comprising:
one or more optical alignment features formed into a surface of the semiconductor substrate;
one or more hard stop structures formed on the surface of the semiconductor substrate, the one or more hard stop structures having a height from the surface of the semiconductor substrate that provides precise positioning of a photodetector device relative to the semiconductor substrate in a vertical direction when the photodetector device is mounted on the semiconductor substrate and structurally supported by the one or more hard stop structures, wherein the vertical direction is substantially perpendicular to the surface of the semiconductor substrate, wherein the one or more optical alignment features facilitate precise optical alignment between a lens assembly and the photodetector device when the lens assembly is coupled with the semiconductor substrate using the one or more optical alignment features; and
a recessed portion formed into a terminating edge of the semiconductor substrate, the recessed portion to serve as a lateral hard stop for precise positioning of the lens assembly in a horizontal direction when the lens assembly is coupled with the semiconductor substrate, wherein the horizontal direction is parallel to the surface of the semiconductor substrate.

21. The semiconductor substrate of claim 20, wherein the one or more optical alignment features include a first feature and a second feature such that the photodetector device, when mounted, is disposed between the first feature and the second feature, wherein the one or more optical alignment features include a V-groove or U-groove channel formed in the semiconductor substrate.

22. The semiconductor substrate of claim 20, wherein the semiconductor substrate is a micro-machined substrate composed of silicon and the one or more hard stop structures include silicon, silicon oxide ($SiO_2$), or silicon nitride (SiN).

* * * * *

UNITED STATES PATENT AND TRADEMARK OFFICE
CERTIFICATE OF CORRECTION

| | | |
|---|---|---|
| PATENT NO. | : 9,099,352 B2 | Page 1 of 1 |
| APPLICATION NO. | : 13/997615 | |
| DATED | : August 4, 2015 | |
| INVENTOR(S) | : John Heck et al. | |

It is certified that error appears in the above-identified patent and that said Letters Patent is hereby corrected as shown below:

In the specification,

Column 1 – AFTER LINE 14 and BEFORE LINE 15 insert:

--GOVERNMENT INTEREST STATEMENT

"This invention was made with Government support under contract number H98230-08- 3-0011 awarded by the Department of Defense. The Government has certain rights in this invention."--

Signed and Sealed this
Eighth Day of March, 2016

Michelle K. Lee
*Director of the United States Patent and Trademark Office*